United States Patent
Karanovic

[19]
[11] Patent Number: 6,058,406
[45] Date of Patent: May 2, 2000

[54] VARIABLE LENGTH FRACTIONAL BANDWIDTH LOW-PASS FILTERING

[75] Inventor: Marinko Karanovic, Don Mills, Canada

[73] Assignee: ATI Technolgies, Inc., Thornhill, Canada

[21] Appl. No.: 09/046,180

[22] Filed: Mar. 23, 1998

[51] Int. Cl.[7] .................................................. G06F 17/10
[52] U.S. Cl. .......................................................... 708/313
[58] Field of Search ............................................. 708/313

[56] References Cited

U.S. PATENT DOCUMENTS

| | | | |
|---|---|---|---|
| 4,748,578 | 5/1988 | Lagadee | 708/313 |
| 5,446,917 | 8/1995 | Krisciunas | 708/313 |
| 5,619,438 | 4/1997 | Farley et al. | 708/313 |
| 5,696,708 | 12/1997 | Leung | 708/313 |
| 5,925,093 | 7/1999 | Yasuda | 708/313 |
| 5,928,313 | 7/1999 | Thompson | 708/313 |

*Primary Examiner*—David H. Malzahn
*Attorney, Agent, or Firm*—Markison & Reckamp, P.C.

[57] ABSTRACT

A variable length fractional bandwidth low-pass filter is implemented as a plurality of filter stages. Each filter stage performs fractional filtering of a plurality of input samples to form an output sample. The number of filter stages is determined based on the characteristic of the filter stage, and the load is suitably balanced to allow for a minimal number of filter stages. Load balancing is applied so as to utilize each of the filter stages only when required. The load balancing is applied so as to provide a substantially equal load to each filter stage, and the number of filter stages is determined so as to allow the filter to operate substantially at the input sample rate.

22 Claims, 8 Drawing Sheets

| t | Increment | Prior R | Sum | Carry | New R |
|---|---|---|---|---|---|
| 0 | 0 | 0 | 0 | 0 | 0 |
| 1 | 3/4 | 0 | 3/4 | 0 | 3/4 |
| 2 | 3/4 | 3/4 | 1 1/2 | 1 | 1/2 |
| 3 | 3/4 | 1/2 | 1 1/4 | 1 | 1/4 |
| 4 | 3/4 | 1/4 | 1 | 1 | 0 |
| 5 | 3/4 | 0 | 3/4 | 0 | 3/4 |
| 6 | 3/4 | 3/4 | 1 1/2 | 1 | 1/2 |
| 7 | 3/4 | 1/2 | 1 1/4 | 1 | 1/4 |
| 8 | 3/4 | 1/4 | 1 | 1 | 0 |
| 9 | 3/4 | 0 | 3/4 | 0 | 3/4 |
| 10 | 3/4 | 3/4 | 1 1/2 | 1 | 1/2 |

VARIABLE LENGTH FRACTIONAL BANDWIDTH LOW-PASS FILTERING

FIELD OF THE INVENTION

This invention relates generally to graphic and video image processing, and in particular to the resizing of an image for display.

BACKGROUND OF THE INVENTION

Graphic and video images are often formed as an array of picture elements. The number of picture elements forming the image determines the resolution, or level of detail, of the image formed by these picture elements. The image is intended to be displayed for viewing on a display that also has individual picture elements. The display will also have a physical size and the display resolution is expressed in terms of picture elements per unit of length in each dimension, for example pixels per inch, or pixels per line. Often, the resolution of the image differs from the resolution of the display, and the image must be scaled to the display. Also, a display is often utilized to display multiple independent images, such as windows on a computer screen, or picture-in-picture images on a television screen. If the image has more pixels than the allocated display area, the image must be downscaled. In this way, the entire image is displayed, albeit at a lesser resolution. If the image has fewer pixels than the allocated display area, the image is upscaled. In this way, the entire allocated display area is utilized.

In addition to scaling an image for display, scaling is also applied, for example, to resize an image from a scanner to a printer, or from a video source to a storage device, etc. The terms input samples and output samples will be used hereinafter to define, in general, discrete values received from an input device and resultant discrete values provided to an output device. Conventionally, a scaling factor, S, is defined in terms of the number of input samples, M, divided by the number of output samples, L.

Integer scaling is straightforward; for example, to downscale by a factor of 2, each pair of input samples can be averaged to provide an output sample; to downscale by a factor of 3, each triplet of input samples is averaged and mapped to an output sample; to upscale by a factor of 2, an interpolated value between every pair of input samples can be provided, and so on. Such direct integer scaling, however, does not allow for fractional scaling, such as 4/3. A 4/3 scaling factor will produce three output samples for every four input samples. Although every fourth input sample could merely be ignored to effect a 4/3 scaling, the resultant output will not be as accurate of a representation of the image as an averaging process, and, the resultant output may contain aberrations caused by aliasing.

Conventionally, to scale an image by a factor of S=M/L, the image is first upscaled by a factor of L, then downscaled by a factor of M. In this manner, sequential integer scaling is used to perform fractional scaling. In a 4/3 example, each input sample provides 3 intermediate output samples, then every four of these intermediate values are processed to provide one output sample. This process, however, will cause aliasing unless the upscaled samples are bandlimited. The larger M is, the more complex the bandlimiting filter required to eliminate aliasing. Conventional systems which allow for user or application defined parameters M and L, such as user definable window sizes, typically contain continuously variable bandwidth digital low pass filters to effect this bandlimiting.

As is common in the art of filter design, optimizations can be effected in the design of filters so as to minimize the time required to process the samples, for example by parallel processing, or to minimize the circuit complexity, for example by using the same circuit repetitively in a sequential process.

Figure 1:
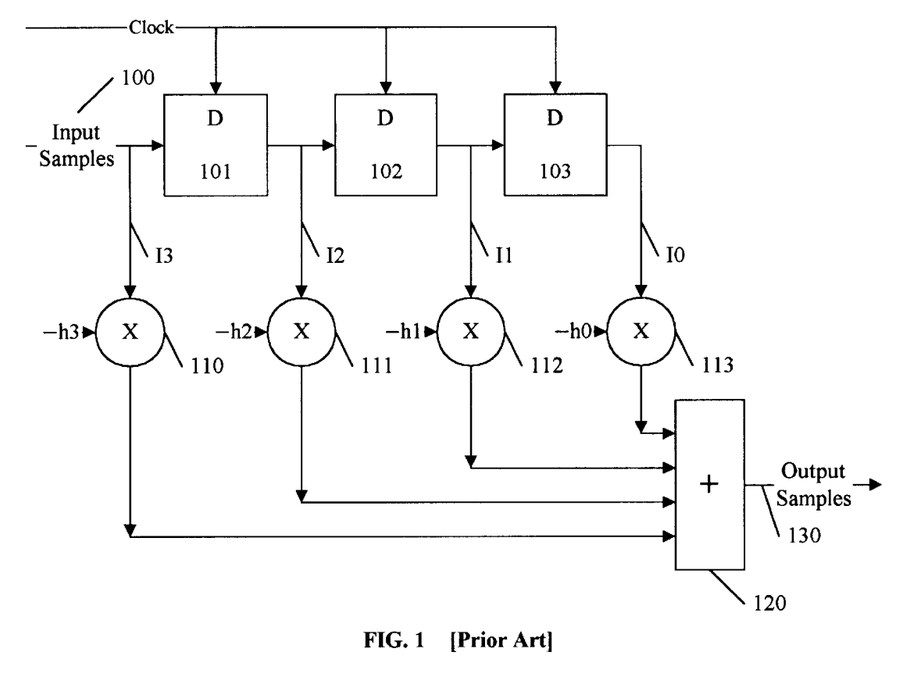
FIG. 1 generally illustrates a prior art direct form vector filter.

FIG. 1 shows a conventional vector filter wherein the input samples 100 are applied sequentially to delay elements 101, 102, 103 to provide samples I0, I1, I2, and I3 that can be processed in parallel. Each of the samples I0, I1, I2, and I3 are multiplied by multipliers 110, 111, 112, and 113 by coefficients h3, h2, h1, and h0, respectively and summed at the adder 120 to produce an output sample 130. The circuit of FIG. 1 will produce a weighted average of 4 samples, and thus would be suited for scaling by a scaling factor having an M of 4: 4/1, 4/2, 4/3, 4/4, 4/5, etc. It would not be suitable, however, for a scaling factor of, for example, 8/5. To average 8 samples, four additional delayed samples, or taps, must be provided to the adder 120. To provide for scaling by a scaling factor S=M/L, in general, requires an M-tap filter, each tap requiring an additional delay-multiply stage. Thus, the conventional vector filter would be implemented as a k-tap filter with k being the maximum allowable M. A problem with this approach, however, is that it must include a tap for every allowable M, and whenever a user or application selects an M that is less than the maximum allowable M, a number of delay-multiply stages will be unused.

Figure 2:
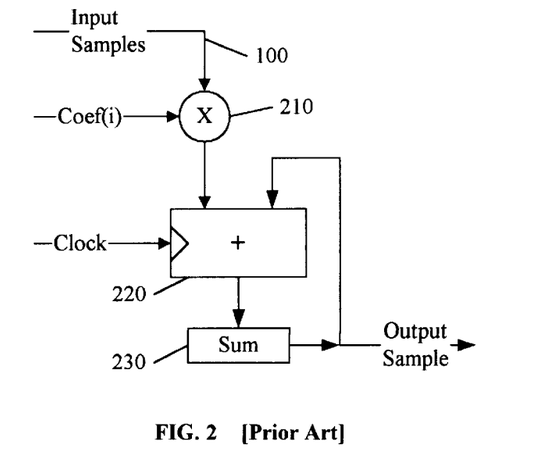
FIG. 2 generally illustrates a prior art sequential form filter.

FIG. 2 shows a conventional sequential filter, having a single multiply-accumulate stage. Each input sample 100 is processed sequentially by multiplying the sample with a coefficient value coef(i) in multiplier 210. At each sequential clock cycle, a new input sample 100 and a corresponding new coefficient value coef(i) are provided. The product of the input sample 100 and its corresponding coefficient value coef(i) is added to a previously accumulated sum and stored as a new accumulated sum in a register 230. After M clock cycles, the register 230 contains the output sample value. Thus, a user or application selected scaling factor can be accommodated by merely increasing the number of clock cycles to the user or application selected M. The next output sample requires another M clock cycles. To provide L output samples within the period of M input samples requires the clock to operate at L times M times the input data rate. To operate at higher than the input data rate requires buffering to accumulate input samples, so that they can be provided to the filter at the higher rate. Additional multiply-accumulate stages may be operated in parallel to reduce the required clock rate proportionately, but again the conventional sequential filter needs to be designed for a highest allowable M and L. As with the conventional vector filter, inefficiencies result whenever the user or application selected M and L are less than the highest allowable values, because circuitry will be unused or underutilized.

Therefore, a need exists for a filter apparatus that performs fractional scaling with minimal circuit complexity and that optimizes the utilization of the circuitry over a wide range of user or application defined scaling factors. A need also exists for a filter that operates at the input data rate, to minimize the need for input data buffering.

DETAILED DESCRIPTION OF THE PREFERRED EMBODIMENT

In accordance with this invention, a variable length fractional bandwidth low-pass filter is provided to perform fractional scaling. The filter is designed as a plurality of filter stages. Each filter stage performs fractional filtering of a plurality of input samples to form an output sample. The number of filter stages is determined based on the characteristic of the filter stage, and the filter stages are load balanced to allow for a minimal number of filter stages. Load balancing is applied so as to utilize each of the filter stages only when required. In the general case, the load balancing is applied so as to provide a substantially equal load to each filter stage, and the number of filter stages is determined so as to allow the filter to operate substantially at the input sample rate.

Figure 3A:
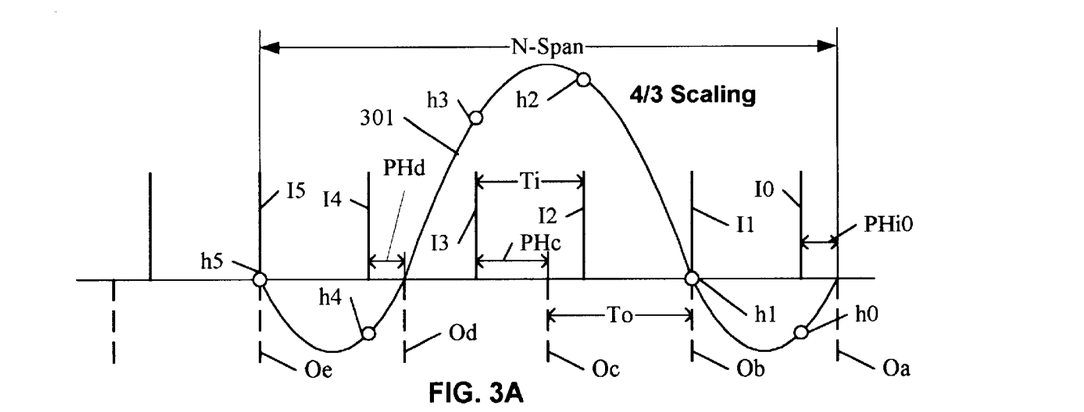
FIGS. 3A–3C illustrate three timing diagrams of fractional scaling of an input stream in accordance with an embodiment of this invention.
Figure 3B:
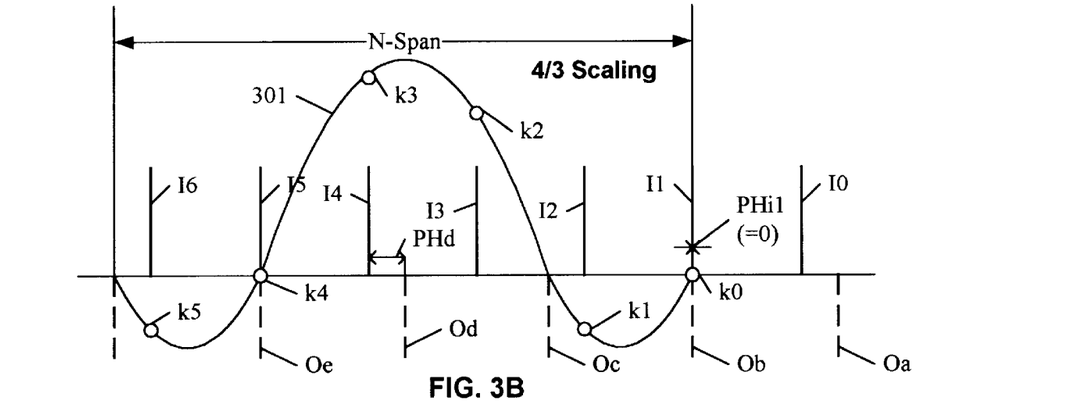
Figure 3C:
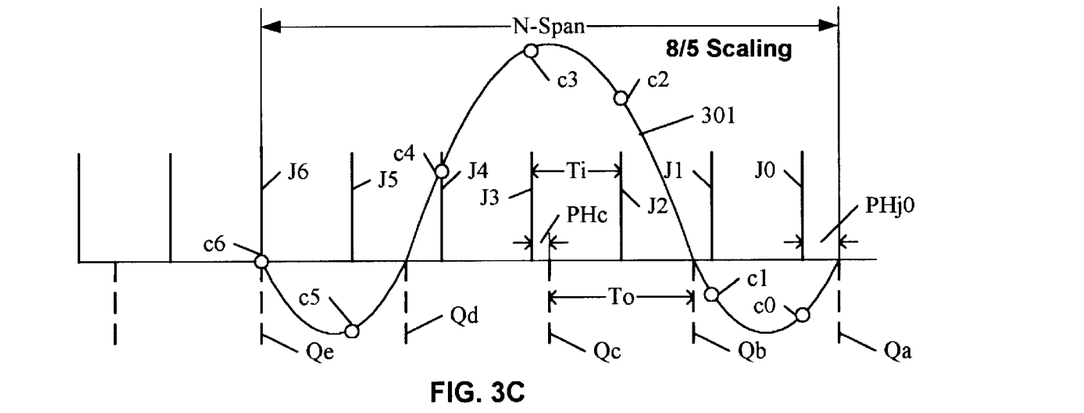

FIGS. 3A–3C illustrate timing diagrams of a variable length fractional bandwidth low-pass filter in accordance with this invention. FIG. 3A shows the timing diagram of a 4/3 scaling of input samples I0, I1, etc. In. to produce output samples Oa, Ob, etc. The time interval between input samples is Ti. To effect a 4/3 scaling, the time interval between output samples is To=4/3*Ti.

Each four input samples produce three output samples. Because fractional scaling is being performed, the output samples Oa, Ob, Oc, etc. will have differing phase relationships to the input stream. As shown, output samples Ob and Oe are in phase with the input stream; Oc is out of phase by an amount PHc; Od is out of phase by an amount PHd; etc.

A filtering, or weighted average, of a set of input samples determines each output sample value. The number of input samples required to produce an output sample is a function of the filter employed. Shown in FIG. 3A is a characteristic filter response 301 for a conventional low pass filter having a filter span of N-Span. The filter response 301 in FIG. 3A is centered about the output sample Oc, representing the use of the filter for determining the value of the output sample Oc:

$$Oc = h0*I0 + h1*I1 + h2*I2 + h3*I3 + h4*I4 + h5*I5. \quad (1)$$

The coefficients h0, h1, . . . h5 in equation (1) are the values of the characteristic filter response 301 corresponding to each of the six input samples within the N-span of the filter, as shown in FIG. 3A. Note that the coefficients h0, h1, . . . h5 are equally spaced, based on Ti, and, because the filter response 301 is centered about output sample Oc, the offset phase PHc determines the particular equally spaced values of the coefficients h0, h1, . . . h5 in equation (1).

FIG. 3B illustrates the application of the same filter response 301 to determine the value of output sample Od:

$$Od = k0*I1 + k1*I2 + k2*I3 + k3*I4 + k4*I5 + k5*I6. \quad (2)$$

The coefficients k0, k1, . . . k5 in equation (2) are the values of the characteristic filter response 301 at each of input samples I1, I2, . . . I6 within the N-span of the filter, as shown in FIG. 3B. Note that because the filter response 301 is centered about output sample Od, the offset phase PHd determines the particular values of the coefficients k0, k1, . . . k5 in equation (2).

Thus it can be seen that given a particular filter response 301, the value of each output sample can be determined based upon the input sample interval Ti, and the offset phase of each output sample relative to the input samples.

FIG. 3C shows the same filter response 301 being applied for an 8/5 scaling of input samples J0, J1, etc. to produce output samples Qa, Qb, etc. The time scale of FIG. 3C is sized to show an equal N-span among FIG. 3A, 3B, and 3C. Within one N-span of the filter 301 are seven input samples; thus, using a filter having the filter characteristic 301, seven input samples will be filtered to produce each output sample. That is, the N-span filter will perform a 7-tap filter function. The filter characteristic 301 is shown centered on output sample Qc, representing the use of the filter for determining the value of the output sample Qc:

$$Qc = c0*J0 + c1*J1 + c2*J2 + c3*J3 + c4*J4 + c5*J5 + c6*J6. \quad (3)$$

The phase PHq of the output sample Qc, relative to the input samples J0, J1, . . . J6 determines the coefficients c0, c1, . . . c6 as shown in FIG. 3C, similar to FIG. 3A and 3B. The value of the next output sample Qd is determined by centering the filter characteristic 301 on Qd and determining the appropriate coefficients based on the input sampling period Ti, and the phase of output sample Qd relative to the input samples.

Thus it can be seen that, as in the 4/3 scaling example above, given a particular filter response 301, the value of each output sample can be determined based upon the input sample interval Ti relative to the filter response 301, and the offset phase of each output sample relative to the input samples. Note that the same filter characteristic 301 is used for each of these scaling factors of 4/3 and 8/5. That is, a single filter design is employed that is independent of the particular scaling factor selected by the user or software application.

The frequency response 301 of FIG. 3A–3C represents a characteristic low-pass filter response. If a scaling factor of 1/1 were employed, the frequency response 301 of FIG. 3A–3C would correspond to a 5-tap low pass filter. As would be evident to one of ordinary skill in the art, other low pass filter responses can be utilized; the quality of the particular filter selected will determine the degree of anti-aliasing provided by the filter. A filter that provides an N-tap filtering at a scaling factor of 1/1 is referred to herein as an N-span filter. The N-span filter is utilized, in accordance with this invention, to perform k-tap filtering, as will be discussed below. The scaling factor determines the number of input samples, or taps, used to form an output sample, based on the N-span of the filter. As shown in FIG. 3A–3C, an N-span filter encompasses N−1 output sample intervals To. If the scaling factor is S, where S is a rational number (=M/L) greater than 1, the number of input samples contained within N-span will be the integer value of ((N−1)*S+1). That is, in using a five-span filter for 4/3 scaling, there are 6[(5−1)*(4/3)+1=6 1/3] input samples within the N-span of the filter, consistent with FIG. 3A. An 8/5 scaling with the same five-span filter has 7[(5−1)*(8/5)+1=7 2/5] input samples within the N-span of the filter, consistent with FIG. 3C. A 3/1 scaling with the same five-span filter has 13[(5−1)*(3/1)+1=13] input samples within the N-span of the filter. Integer scaling is merely a particular case of fractional scaling, wherein M/L is an integer. As would be evident to one of ordinary skill in the art, optimizations can be applied to reduce the processing for the particular case of integer scaling, for example by averaging 3 input samples as in the conventional system, rather than processing 13 input samples. To minimize complexity, the preferred embodiment utilizes the same fractional filter regardless of whether the scaling factor is an integer or non-integer.

Thus it is shown that the same filter characteristics can be utilized to effect integer and fractional scaling, the required filter parameters being: the phase of each output sample relative to the input samples, the number of input samples used to form each output sample, and the input sample interval, Ti, relative to the N-span filter. Because the filter parameters required to produce an output sample from the input samples are minimal, this fractional scaling lends itself readily to the use of multiple filter stages, each operating with the particular set of filter parameters for the output sample being produced.

Figure 4:
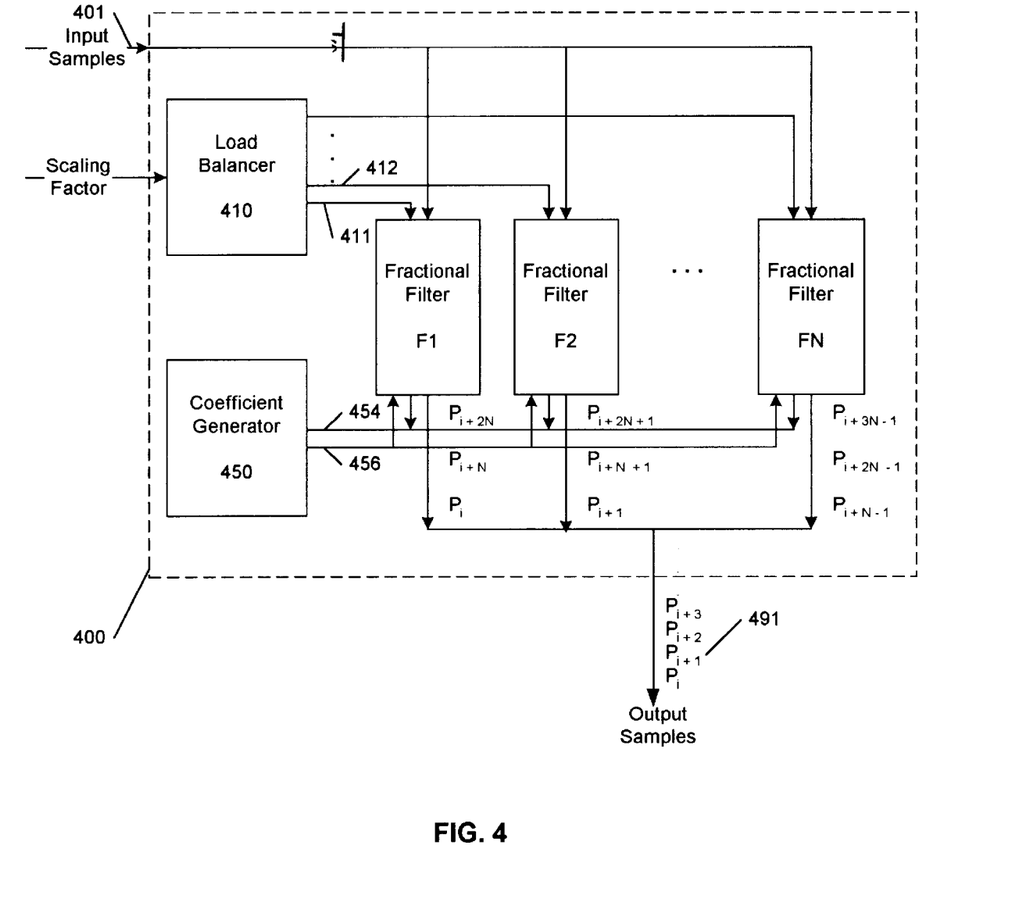
FIG. 4 illustrates a block diagram of a variable length fractional filter in accordance with an embodiment of this invention.

FIG. 4 shows a block diagram of an embodiment of a variable length fractional filter in accordance with this invention. The variable length fractional filter includes a load balancer 410, a coefficient generator 450, and a plurality of filter stages F1, F2, . . . FN. The load balancer 410 performs a controlling function for synchronizing the operation of the filter stages F1, F2, . . . FN, and provides the required filter control parameters 411, 412, etc. to produce each output sample Pi, Pi+1, Pi+2, etc. at the required output intervals. Each filter stage F1, F2, . . . FN is operably coupled to the coefficient generator 450 for requesting 454 and receiving 456 the particular coefficients to be applied to each of the input samples 401. The particular coefficients 456 for each filter stage will be dependent upon the phase difference between the input samples and the output sample being produced by the particular filter stage, as well as the phase interval corresponding to input timing interval relative to the filter span, as determined by the scaling factor. This information is communicated to the coefficient generator 450 from each filter F1, F2, . . . FN via 454. In a preferred embodiment of this invention, the load balancer 410 sequentially selects, via 411, 412, etc. each of the filter stages F1, F2, . . . FN, F1, F2, . . . to produce the output samples Pi, Pi+1, . . . Pi+N−1, Pi+N, Pi+N+1, . . . in a sequential, round-robin, manner. That is, all of the filter stages are utilized as much as possible and all are utilized uniformly. As shown in FIG. 4, under the control of load balancer 410, filter stage F1 produces an output Pi; filter stage F2 produces the next output Pi+1; and so on, such that filter stage FN produces output sample Pi+N−1, then filter stage F1 produces output sample Pi+N, and so on. To be effective, each of the filter stages is designed to process all of the required input samples before the load balancer 410 cycles back to it.

In the preferred embodiment, the variable length fractional filter will contain a minimum number of filter stages. In accordance with this invention, each filter stage is an N-span fractional filter, and the minimum number of filter stages is equal to N, the span of the fractional filter, as discussed below.

Each filter stage processes input samples throughout a duration of N-span. As the scaling factor varies, the number of input samples contained within N-span varies. While these input samples arrive, the filter stage is unavailable for processing other input samples. In the preferred embodiment of this invention, the filter stages are optimized with respect to the output samples and the number of filter stages is minimized. That is, each N-span filter stage will be available for reuse after (N−1) output sample intervals. In the preferred embodiment, one filter stage is utilized to produce one output sample, with no underutilization. Because each filter stage is available for reuse after (N−1) output sample intervals, N filter stages are sufficient to assure that a filter stage is available when required to generate each output sample.

In the preferred embodiment, the determination of N is a balance of performance and cost. Increasing N, the number of taps in the fractional filter stage for 1/1 scaling, improves the anti-aliasing quality of the filter stage, but also increases the number of filter stages required to be operated in parallel. Typically, N is in the range of five to fifteen.

Figure 5:
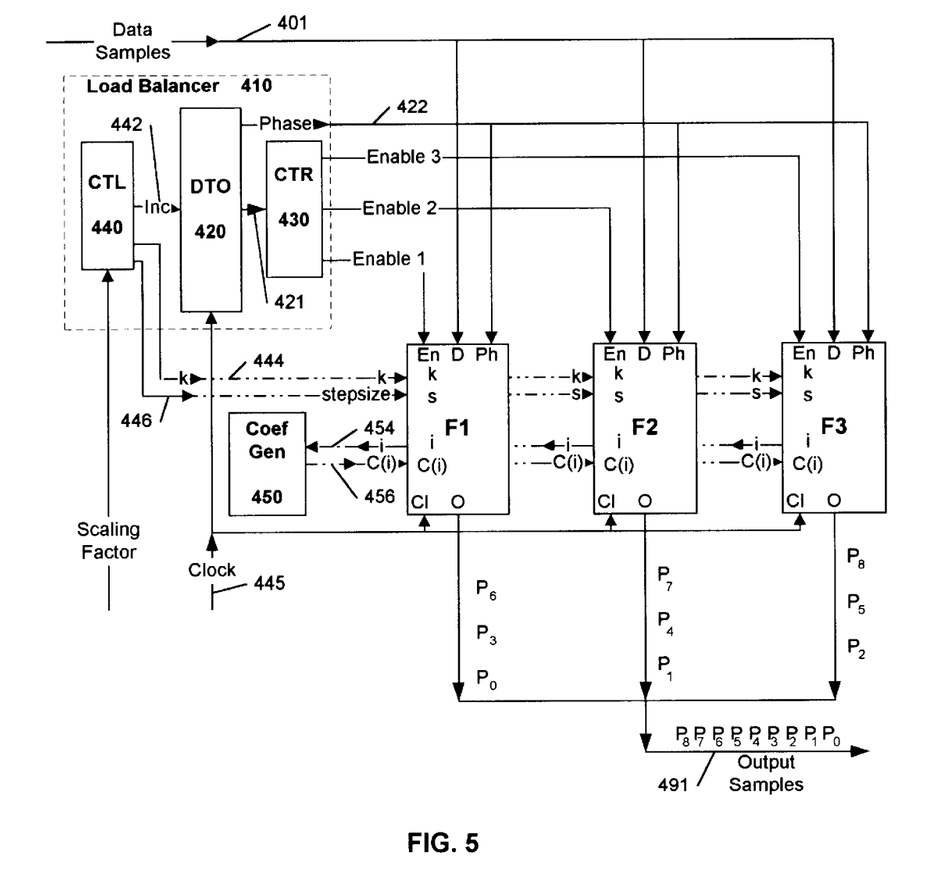
FIG. 5 illustrates a block diagram of a preferred implementation of a variable length fractional filter in accordance with an embodiment of this invention.

FIG. 5 shows a more detailed block diagram of an embodiment of the invention. The load balancer 410 includes a controller 440, a discrete time oscillator 420 and a counter 430. The controller 440 processes the provided scaling factor to determine an increment factor 442 for the discrete time oscillator 420, the number of input samples k 444 contained within the N-span, and the phase stepsize 446, corresponding to the input sample interval Ti. The filter stages F1, F2, and F3 each perform N-span fractional filtering. The discrete time oscillator 420 generates a trigger pulse 421 each time an output sample is to be generated, based on the increment value provided by the controller 440. A clock signal 445 maintains the proper timing relationship of the discrete time oscillator 420 relative to the input samples 401. That is, for example, if a 4/3 scaling is being performed, the discrete time oscillator 420 produces three trigger pulses 421 for every four clock cycles 445, assuming one clock cycle 445 per input sample 401.

Figure 6A:
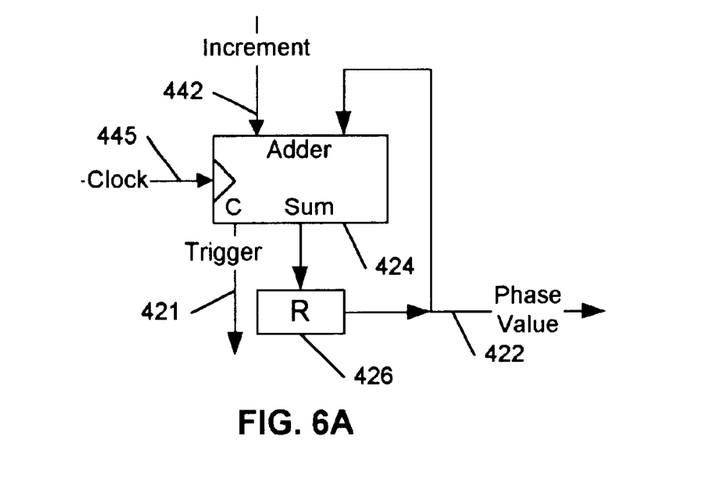
FIGS. 6A and 6B illustrate a block diagram of a discrete time oscillator suitable for use in a variable length fractional filter in accordance with an embodiment of this invention.
Figure 6B:
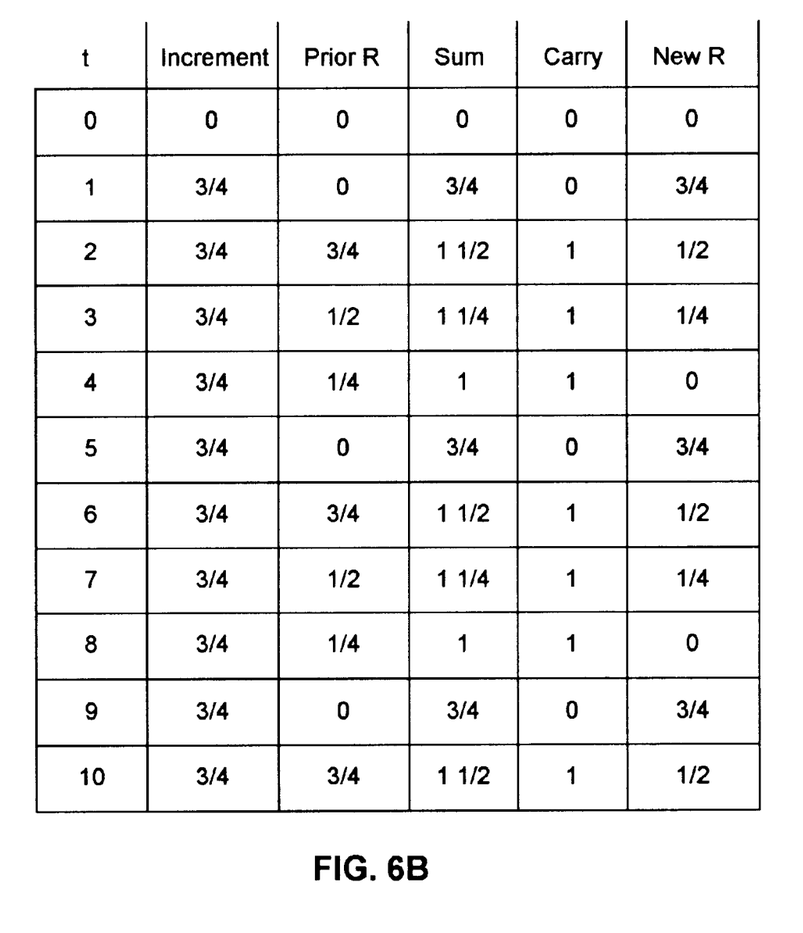

A block diagram of one example of a discrete time oscillator 420 is shown in FIG. 6A. The discrete time oscillator 420 includes a sequential adder 424 and a register 426. At each clock cycle 445, an increment value 442 is added to the contents of the register 425. After some number of clock cycles 445, the sum of the increment value 442 and the contents of the register 425 will be larger than the maximum value that the register 426 can contain, and a carry will be generated by the adder 424. This carry is the trigger pulse 421 of FIG. 5. The remainder of the sum less the maximum value is stored in the register 426. A table representing an example of the operation of this oscillator 420 is shown in FIG. 6B. The increment value, prior register value, sum, carry, and new register value are shown for each clock cycle at t=1, t=2, . . . t=10. Initially, at time t=0, all variables are reset to contain a value of zero. In this example, the controller 440 provides an increment value of ¾ of the register's maximum value. At the first clock cycle, at t=1, the increment value of ¾ is added to the prior register value of 0 to produce a sum of ¾, and no carry. The new register value is ¾. At t=2, the increment of ¾ is added to the prior register value of ¾ to produce a sum that is 1½ times as large as the maximum. Therefore, a carry pulse is generated, and the new register value is ½ [1½−1]. At t=3, the increment of ¾ is added to the prior register value of ½ to produce a sum of 1¼; a carry pulse is generated, and the new register value is ¼. At t=4, the increment of ¾ is added to the prior register value of ¼ to produce a sum of 1; a carry pulse is generated, and the new register value is 0. This cycle is thereafter repeated. As can be seen, by using this increment of ¾ of the maximum register value, three carry pulses are generated repeatedly for each four clock cycles. An increment value of A/B will produce A carry pulses for each B clock cycles. In the preferred embodiment, the clock cycles correspond to the input samples, and the number of carry pulses corresponds to the number of output pulses corresponding to the number of input samples. That is, to effect a B/A scaling, the controller 440 provides an increment of A/B times the maximum register 426 value to the discrete time oscillator 420, to generate one trigger pulse 421 for each output sample 491.

The register 426 also provides a measure of the phase difference between the input and output samples. A register value of 0, for example at time t=4 above, corresponds to the output sample being in phase with the input. A register value of ½ the maximum value corresponds to the output sample being 180 degrees out of phase with the input sample; a value of ¼ the maximum value corresponds to a 90 degree difference, and so on. Referring to FIGS. 3A–3C, this register value corresponds to the phase difference between the start of the N-span filter response and the first input sample within the N-span. That is, in FIG. 3A, the register value corresponds to the phase difference PHi0; in FIG. 3B, the register value corresponds to the phase difference PHi1; in FIG. 3C, the register value corresponds to the phase difference PHj0. In FIG. 3B, the output Ob and the input I1 are in phase, and the coefficient k0 is located at the start of the frequency response 301, reading from right to left. Each subsequent coefficient k1, k2 . . . k5 will be located at equidistant points from the start of the frequency response 301, at intervals corresponding to the interval between input samples.

In FIG. 3A, the input I0 is offset to the left of the start of the N-span by an offset amount PHi0. The contents of the register 426 will correspond to this offset amount PHi0 when the input 10 arrives. The coefficient h0 will be located a distance corresponding to a phase offset amount PHi0 into the frequency response 301, and each subsequent coefficient h1, h2, etc. will be located at equidistant points from the location of coefficient h0, at intervals corresponding to the interval between input samples. The interval between coefficients, herein referred to as the phase stepsize, is equal to the phasewidth of the filter stage response 301 divided by the scaling factor. An N-span filter will have a phasewidth of (N−1) times 360 degrees. Thus, expressed in degrees, the phase stepsize is equal to 360*(N−1)/S, where S is the scaling factor, and N is the span of the filter stage.

In FIG. 5, the discrete time oscillator 420 provides the trigger pulses 421 to the counter 430, and the phase values 422 to the filter stages F1, F2, and F3. The counter 430 increments its value with each trigger pulse, and sequentially asserts each of the Enable 1, Enable 2, and Enable 3 signals. The counter 430 cycles back to Enable 1 after asserting Enable 3, thus, each of the filter stages F1, F2, and F3 are sequentially enabled, in a round-robin fashion. In the general case, with N filter stages, the counter 430 generates an enable for each of the N filter stages in a sequential fashion, and each filter stage is connected in parallel with filter stages F1, F2, etc.

Figure 7:
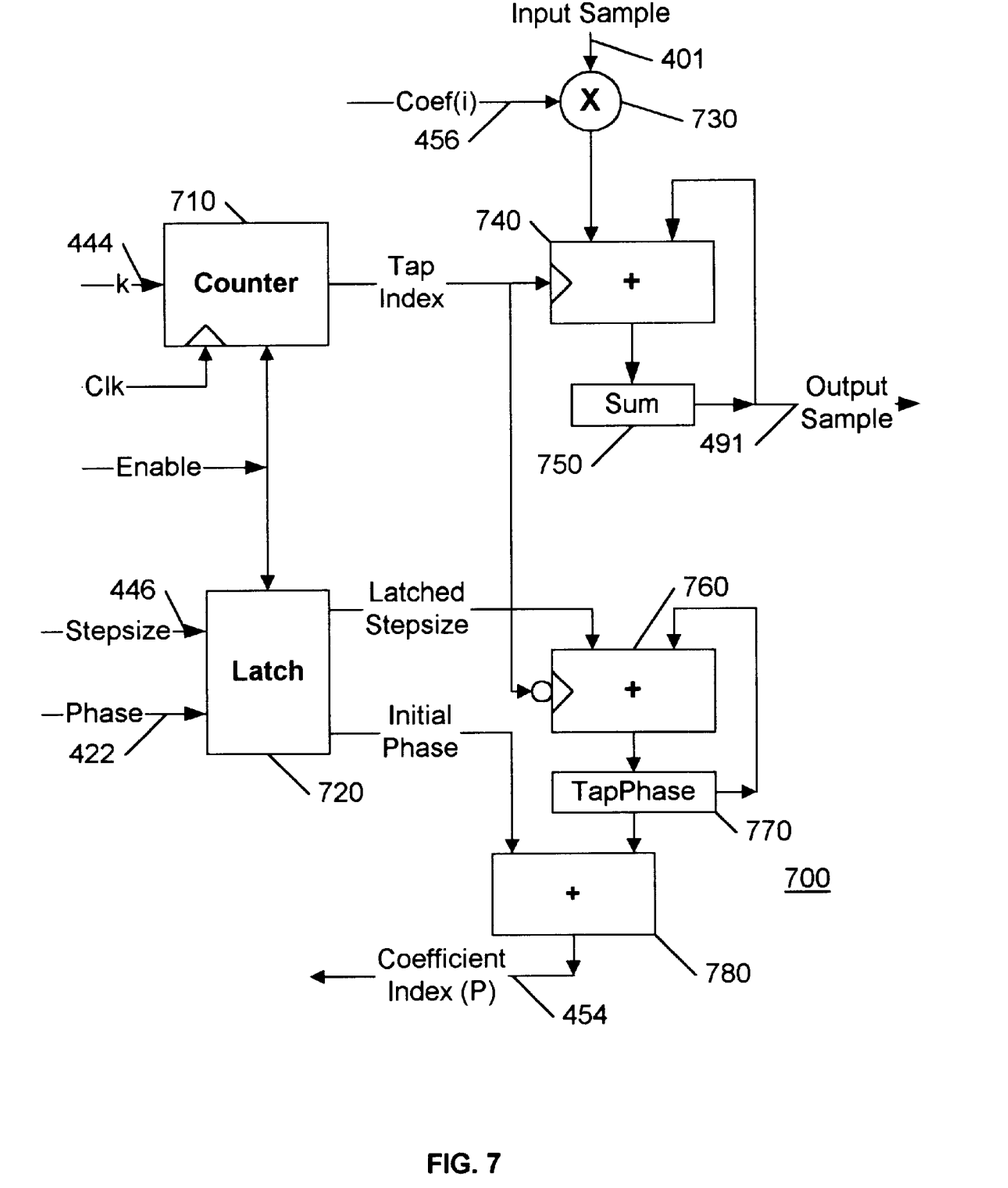
FIG. 7 illustrates a block diagram of a finite impulse response (FIR) filter stage for use in a variable length fractional filter in accordance with an embodiment of this invention.

FIG. 7 shows one example of an accumulating finite impulse response (FIR) filter stage 700 suitable for use as filter stages F1, F2, . . . FN. The FIR filter stage 700 includes a counter 710 for counting the number of input samples, and a latch 720 for storing initial values. Upon receiving an enable signal, the phase value 422 and the phase stepsize 446 are loaded into the latch 720. The enable signal also enables the counter 710 which generates a count for each of k input samples, k 444 being provided by the controller 442, based on the scaling factor. Each input sample is multiplied at 730 by a coefficient 456. To determine the value of the coefficient 456, the FIR filter stage 700 generates a coefficient index 454. The sum 750 and tapphase 770 registers are initialized to zero, and therefore initially the coefficient index 454 is equal to the initial phase value, the phase 422 which is latched when the FIR filter stage 700 is enabled. The coefficient 456 corresponding to the initial phase value is multiplied with the first input sample, and the sequential adder 740 stores the sum of this product and the prior sum value (0) into the sum register 750. The counter increments, causing the sequential adder 760 to add the latched stepsize to the prior contents of the tapphase 770 register. Note that the sequential adder 760 is shown to be out of phase with the sequential adder 770, to provide sufficient time for the new coefficient index 454 to be conveyed to the coefficient generator and the corresponding coefficient value 456 to be generated and multiplied with the next input sample 401. After each of k input samples 401 are multiplied by the appropriate coefficient 456, based on the initial phase, and the products accumulated in the sum register 750, the contents of the sum register 750 are communicated as the next of the output samples 491.

The coefficient generator 450 of FIG. 4 and FIG. 5 returns a filter coefficient value 456 corresponding to a coefficient index 454. This may be accomplished in a variety of ways, as would be evident to one of ordinary skill in the art. In an example embodiment, the filter response 301 of FIGS. 3A–3C may be stored as a table in memory. The coefficient index 454 provides an index into the table, and the values corresponding to h0, h1, etc. shown in FIG. 3A are returned as coefficient values 456. Alternatively, an algorithmic description of the filter response 301 may be used to compute a coefficient value 456 for each coefficient index 454 directly. A combination of both techniques may be provided, wherein the most significant bits of a coefficient index 454 are used to access a table of values, and the lower significant bits are used to interpolate a value between the stored values.

Figure 8A:
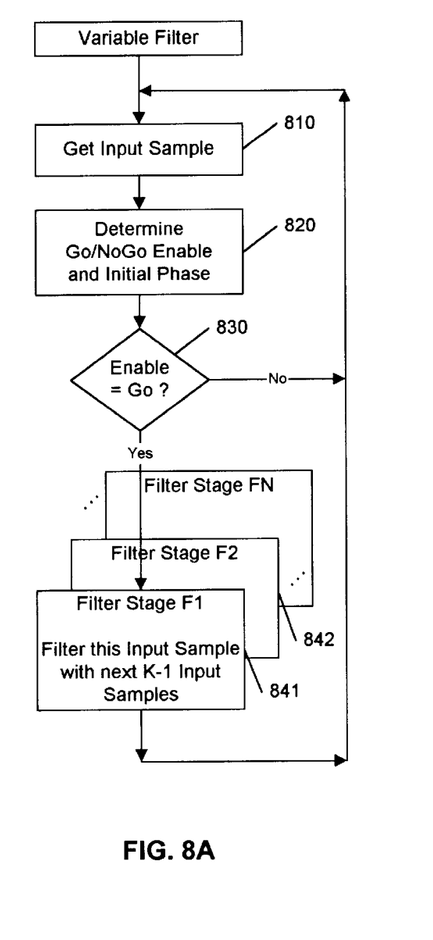
FIGS. 8a and 8b illustrate flow charts for load balancing a plurality of filter stages in accordance with an embodiment of this invention.
Figure 8B:
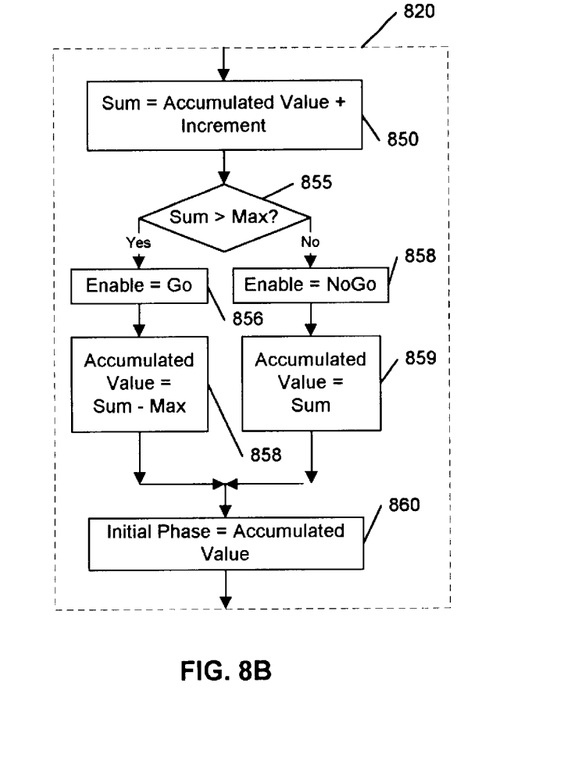

FIG. 8A and FIG. 8B shows flowcharts for load balancing a plurality of filter stages in a ariable length fractional filter 400, as might be used, for example, in an embodiment of the load balancer 410 of FIG. 4 for balancing the load of filter stages F1, F2, . . . FN. In FIG. 8A, the filter 400 receives an input sample, at 810. This input sample is thereafter available to each of the filter stages F1, F2, . . . Fn, represented by filter stage processes 841, 842, . . . in FIG. 8A. For each received input sample, a determination is made by the load balancer 410 as to whether an output sample is to be generated, at 820. That is, for example, given an 8/5 scaling, five of every eight input samples trigger an output sample, and three of eight do not. FIG. 8B shows a preferred embodiment of the process 820. At 850 an increment, corresponding to an inverse of the scaling factor, is added to an accumulated value to form a sum, as discussed above with regard to the discrete time oscillator of FIG. 6. The sum is compared to a maximum value, at 855. The maximum value is a value corresponding to 360 degrees phase shift. Whenever the phase shift exceeds 360 degrees, a new output sample is required. If, at 855, the sum is greater than the maximum, an enable is set to the affirmative "Go" at 856, and the accumulated value is set equal to the sum less the maximum value. In so doing, the accumulated value will be the residual phase, modulo 360 degrees. If the sum is less than the maximum, the enable is set to the negative "NoGo", at 858, and the accumulated value is set equal to the sum. At 860, an initial phase value is set equal to this accumulated value. Upon completion of the process 820, the load balancing process continues at 830 in FIG. 8A.

If, at 830, the enable is set to Go, one of a multitude of filter stage processes 841, 842, etc. is launched by the load balancer 410. The load balancer 410 provides the initial phase to the selected filter stage process, and continues the load balancing process, at 810, for each subsequent input sample. If the enable is not Go, the process bypasses the launching of a filter stage process. Thus, as can be seen, in a preferred embodiment, each filter stage process is utilized if and only if an output sample is required, thereby optimizing the utilization of each filter stage process.

Figure 9:
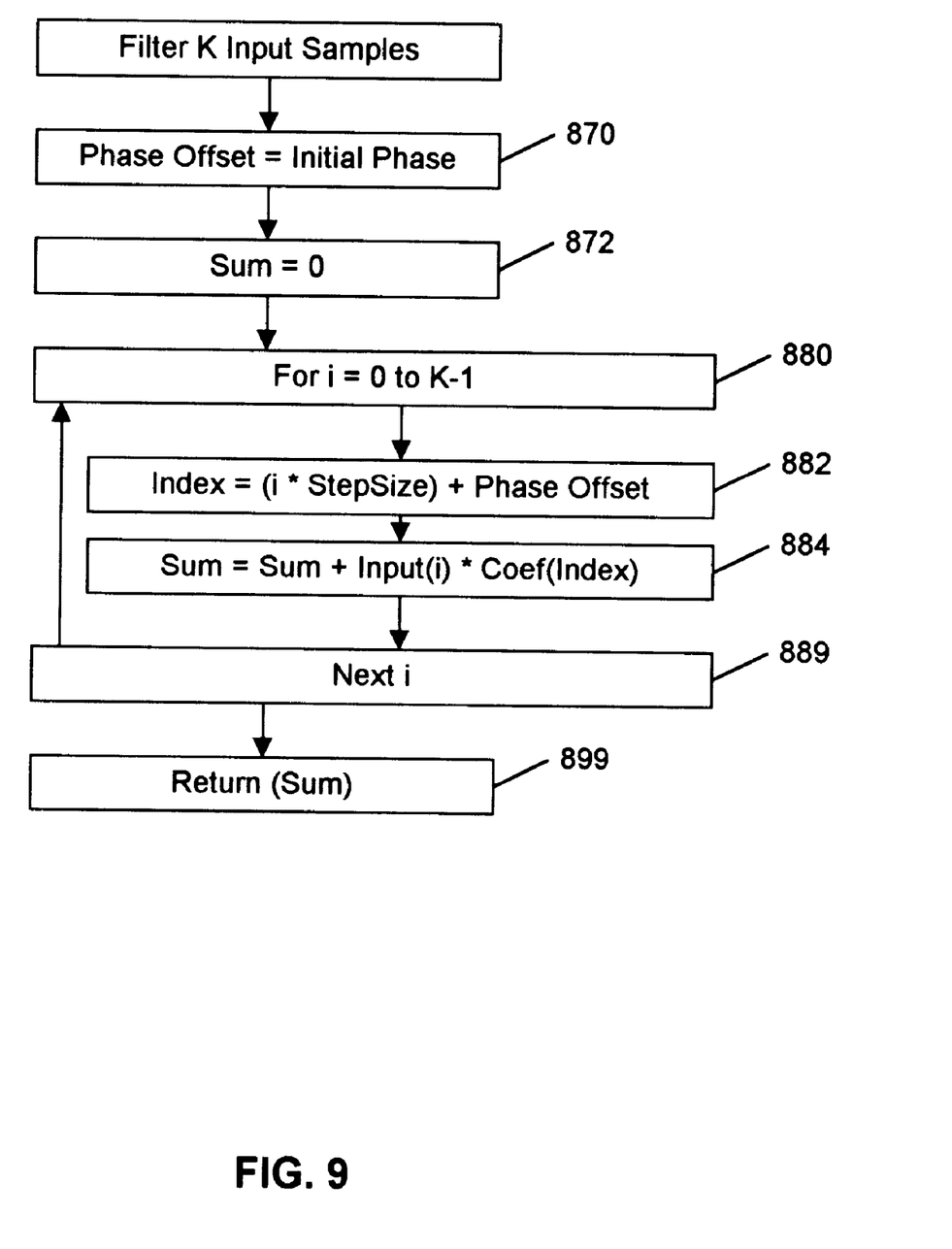
FIG. 9 illustrates a flow chart for a filter stage in accordance with an embodiment of this invention.

A preferred embodiment of the filter stage processes 841, 842, etc. of FIG. 8A, is shown as a flowchart in FIG. 9. The process of FIG. 9, may for example, be implemented in each of the filter stages F1, F2, . . . FN of FIG. 4. When a selected filter stage, Fs, is selected and launched by the load balancer 410, the load balancer 410 communicates the initial phase of the input sample relative to the output samples to the selected filter stage Fs. The filter stage Fs stores this initial phase as a phase offset, at 870, and initializes a sum variable to zero, at 872. The filter stage Fs iterates through the loop 880–889 for each of k input samples, starting with the input sample that triggered the launch of this filter stage Fs. At 882, the filter stage Fs computes the coefficient index corresponding to the $i^{th}$ input sample by adding a multiple of the phase stepsize to the phase offset. As discussed above, the phase stepsize is a variable corresponding to the input sample interval Ti of FIGS. 3A–3C relative to the N-span filter response, as determined by the scaling factor S. Expressed in degrees, the stepsize is equal to 360*(N−1)/S. The phase offset determines where on the filter stage characteristic 301 the first of the uniformly spaced coefficients are located, and the phase stepsize determines where the subsequent coefficients are located. The coefficient index corresponding to the $i^{th}$ input sample is provided to a coefficient function Coef(), at 884, that returns the coefficient value corresponding to this coefficient index. As discussed above, this function may be an array of values indexed by the coefficient index, or an algorithmic function, or a combination of both. The filter stage Fs multiplies the coefficient value corresponding to the $i^{th}$ input sample by the value of the $i^{th}$ input sample, and adds the product to the sum value, at 884. After processing k input samples, the filter stage Fs returns the sum value, at 899. This sum value is the output sample value. Upon returning the output sample value, the filter stage Fs is available to process the input samples corresponding to another output sample. As discussed above, the processing of k input samples by an N-span filter stage will be completed within N output samples. Thus, because a filter stage process is launched if and only if an output sample is required, the number of filter stages can be limited to N.

As is evident to one of ordinary skill in the art, the functions performed by the blocks and processes discussed above can be implemented in hardware, software, or a combination thereof. For example, the filter stages F1, F2, etc. can be hardware devices, and the load balancer 410 and coefficient generator 450 can be implemented as software or firmware executing on a general or special purpose processor. Similarly, the use of particular structures to effect these functions need not be employed. For example, although the discrete time oscillator 420 has been presented as a preferred embodiment for a load balancer, any technique that identifies the need for an output sample can be equivalently employed. Similarly, alternative means for determining the relationship between the input and output samples so as to determine the appropriate filter stage coefficients would be evident to one of ordinary skill in the art. Accordingly, the foregoing merely illustrates the principles of the invention. It will thus be appreciated that those skilled in the art will be able to devise various arrangements which, although not explicitly described or shown herein, embody the principles of the invention and are thus within its spirit and scope.

I claim:

1. A variable length fractional filter comprising:
   a plurality of filter stages operably coupled to perform fractional filtering on a plurality of input samples to produce a plurality of output samples; and
   a load balancer operably coupled to balance the plurality of filter stages to each filter a substantially equal number of the plurality of input samples, based on a receive scaling factor data.

2. The filter of claim 1, wherein each filter stage of the plurality of filter stages is an accumulating finite impulse response (FIR) filter.

3. The filter of claim 1, wherein
   each of the plurality of input samples occur at a first periodic interval, and
   each of the plurality of filter stages produce an output sample, such that the output of the plurality of filter stages produces the plurality of output samples occurring at a second periodic interval which is substantially equal to a product of the scaling factor data and the first periodic interval.

4. The filter of claim 3, wherein the plurality of input samples corresponds to a video image at a first resolution, and the plurality of output samples correspond to the video image at a second resolution.

5. The filter of claim 1, also comprising
   a coefficient generator operably coupled to the plurality of filter stages to provide coefficients based on phase differences between the input samples and the output samples.

6. The filter of claim 1, wherein the load balancer includes
   a discrete time oscillator to provide a series of trigger pulses, and
   a counter operably coupled to receive the series of trigger pulses and to produce a plurality of enable signals, each of the enable signals of the plurality of enable signals corresponding to one of the plurality of filter stages.

7. The filter of claim 6, wherein
   the discrete time oscillator also provides a series of initial phase values corresponding to each trigger pulse; and
   each filter stage of the plurality of filter stages is operably coupled to receive the corresponding one of the enable signals, and to receive a corresponding initial phase value of the plurality of phase values in dependence upon the corresponding one of the enable signals.

8. The filter of claim 7, also comprising
   a coefficient generator operably coupled to each of the plurality of filter stages to provide coefficients based on the scaling factor and the initial phase value corresponding to the each of the plurality of filter stages.

9. The filter of claim 8, wherein
   the coefficient generator includes a plurality of predetermined coefficient values.

10. The filter of claim 1, wherein the load balancer is configured to allocate a substantially equal computational load to each of the plurality of filter stages.

11. A method for variable length fractional filtering comprising the steps of:

balancing the allocation of a plurality of filter stage processes to filter a substantially equal number of a plurality of input samples based on a received scaling factor data, and performing fractional filtering on the plurality of input samples within each of the plurality of filter stage processes to produce a plurality of output samples.

12. The method of claim 11, wherein the plurality of input samples corresponds to a video image at a first resolution, and the plurality of output samples correspond to the video image at a second resolution.

13. The method of claim 11, wherein the step of performing fractional filtering includes the steps of:

generating coefficients based on phase differences between the input samples and the output samples corresponding to each of the substantially equal number of input samples, and accumulating a product of each coefficient and the corresponding each of the substantially equal number of input samples to produce each output sample of the plurality of output samples.

14. The method of claim 13, wherein the step of balancing the allocation of the plurality of filter stage processes includes the steps of:

providing a series of trigger pulses corresponding to each output sample, and processing the trigger pulses to produce a plurality of enable signals, each of the enable signals of the plurality of enable signals corresponding to one of the plurality of filter stage processes.

15. The method of claim 11, including the steps of:

determining an enable value and an initial phase value corresponding to each of the plurality of input samples;

filtering the substantially equal number of the plurality of input samples when the enable value is a first enable value, said filtering being based on the initial phase value.

16. The method of claim 15, wherein the step of filtering the substantially equal number of the plurality of input samples includes the steps of:

determining a plurality of coefficient values based on the initial phase value, each coefficient value of the plurality of coefficient values corresponding to one of the substantially equal number of the plurality of input samples;

multiplying each one of input samples by the corresponding each of the coefficient values to produce a plurality of products; and accumulating each of the plurality of products to produce a filtered output sample.

17. The method of claim 15, wherein the step of determining the enable value and the initial phase value includes the steps of:

adding a predetermined increment value to an accumulated value;

setting the enable value to the first enable value when the accumulated value equals or exceeds a maximum value, and setting the enable value to a second enable value when the accumulated value is less than the maximum value;

subtracting the maximum value from the accumulated value when the accumulated value equals or exceeds the maximum value; and setting the initial phase value equal to the accumulated value.

18. The method of claim 17, wherein the step of filtering the substantially equal number of the plurality of input samples includes the steps of:

determining a plurality of coefficient values based on the initial phase value, each coefficient value of the plurality of coefficient values corresponding to one of the plurality of input samples;

multiplying each of input samples by the corresponding each of the coefficient values to produce a plurality of products; and accumulating each of the plurality of products to produce a filtered output sample.

19. An apparatus for fractionally filtering a plurality of input samples, comprising:

means for determining an enable value to selectively enable a plurality of means for filtering and for determining an initial phase value corresponding to each of the plurality of input samples; and a plurality of means, operably responsive to the means for determining the enable value, for filtering a predetermined number of the plurality of input samples when the enable value is a first enable value to produce an output sample, the filtering being based on the initial phase value.

20. The apparatus of claim 19, wherein each of the plurality of means for filtering the predetermined number of the plurality of input samples includes:

means for determining a plurality of coefficient values based on the initial phase value, each coefficient value of the plurality of coefficient values corresponding to each of the predetermined number of the plurality of input samples;

means for multiplying each of the predetermined number of the plurality of input samples by the corresponding each of the coefficient values to produce a plurality of products; and means for accumulating each of the plurality of products to produce a filtered output sample.

21. The apparatus of claim 19, wherein the means for determining the enable value and the initial phase value includes:

means for adding a given increment value to an accumulated value corresponding to each of the plurality of input samples;

means operably coupled to the means for adding for setting the enable value to the first enable value when the accumulated value equals or exceeds a maximum value, and setting the enable value to a second enable value when the accumulated value is less than the maximum value;

means operably coupled to the means for adding for subtracting the maximum value from the accumulated value when the accumulated value equals or exceeds the maximum value; and means operably coupled to the means for subtracting for setting the initial phase value equal to the accumulated value.

22. The apparatus of claim 21, wherein each of the plurality of means for filtering the predetermined number of the plurality of input samples includes:

means for determining a plurality of coefficient values based on the initial phase value, each coefficient value of the plurality of coefficient values corresponding to each of the predetermined number of the plurality of input samples;

means for multiplying each of the predetermined number of the plurality of input samples by the corresponding each of the coefficient values to produce a plurality of products; and means for accumulating each of the plurality of products to produce a filtered output sample.

* * * * *